United States Patent [19]

Markus

[11] 3,827,045

[45] July 30, 1974

[54] ANGLE DIGITAL CONVERTER SYSTEM

[76] Inventor: Dusan K. Markus, 11 E. Magna Vista St., Arcadia, Calif. 91006

[22] Filed: Dec. 18, 1972

[21] Appl. No.: 315,946

[52] U.S. Cl.. 340/347 AD, 235/92 BD, 235/92 CV, 340/347 SY

[51] Int. Cl. .......................................... H03k 13/02

[58] Field of Search .............. 340/347 AD, 347 SY; 235/186, 92 MP, 92 CV, 92 EV, 92 BD

[56] References Cited

UNITED STATES PATENTS

| | | | |
|---|---|---|---|
| 2,984,831 | 5/1961 | Oken et al. | 340/347 SY |
| 3,071,324 | 1/1963 | Schroeder et al. | 340/347 SY |
| 3,139,613 | 6/1964 | De Negri | 235/92 CV |
| 3,335,417 | 8/1967 | Adler et al. | 340/347 SY |
| 3,363,244 | 1/1968 | Milroy | 340/347 SY |
| 3,493,735 | 2/1970 | Heaviside et al. | 235/186 |
| 3,493,964 | 2/1970 | Hunger | 235/92 CV |
| 3,611,354 | 10/1971 | Gordon et al. | 340/347 AD |
| 3,636,554 | 1/1972 | Farneth | 340/347 SY |
| 3,728,719 | 4/1973 | Fish | 340/347 SY |
| 3,737,639 | 6/1973 | Fletcher et al. | 235/186 |

FOREIGN PATENTS OR APPLICATIONS

| | | | |
|---|---|---|---|
| 971,715 | 10/1964 | Great Britain | 340/347 |

OTHER PUBLICATIONS

Hodges, "Digital-To-Synchro Converter" IBM Technical Disclosure Bulletin; Vol. 12, No. 10; March 1970; pp. 1639–1640.

*Primary Examiner*—Charles E. Atkinson
*Assistant Examiner*—Errol A. Krass
*Attorney, Agent, or Firm*—Linval B. Castle

[57] ABSTRACT

An improved system is provided for converting synchro or resolver shaft analog input data into corresponding digital outputs. The system effectuates the conversion by means of a null type circuit which includes a ladder network under the control of up/down counters and read-only memories, the latter being addressed by the counters and serving as a tangent function generator.

11 Claims, 7 Drawing Figures

PATENTED JUL 30 1974

3,827,045

SHEET 1 OF 5

ANGLE DIGITAL CONVERTER SYSTEM

BACKGROUND OF THE INVENTION

Shaft angle-digital converters are well known to the art. The system of the present invention represents a unique approach to such converters by the use of read-only memories under the control of up/down counters, in conjunction with a digital servo loop, to achieve the conversion. The system to be described is capable of extremely high resolution, but it requires relatively simple circuitry and uses readily available solid state integrated circuit components.

The system of the invention serves to interface between synchro or resolver analog equipment and control and/or data logging equipment. The system serves to convert analog signals from a synchro or resolver transmitter to corresponding digital signals. The shaft angle analog input of the system may be displayed directly on its front panel by solid state light-emitting diodes under the control of a binary to binary coded decimal (BCD) converter and other circuits to be described. The digital output of the system may also be introduced to digital control or data logging apparatus. Moreover, the data may be supplied to such apparatus as a parallel binary input in a form compatible with integrated circuitry.

The apparatus and system of the invention may be used, for example, for testing synchro or resolver transmitters under open loop or fully loaded conditions. The system has high input impedance, and full control of its input circuitry, thus enabling the system to be used with a wide variety of components. The binary coded decimal outputs produced by the system in correspondence with the input angles, provide a means for permanently recording final production test results, or the results of other inspections. The system also has the capacity of providing pure binary outputs corresponding to the input angles, producing binary outputs corresponding to the tangents of the input angles. It can also produce direct current analog output representative of the input angles.

In general, the system of the invention serves to convert angular analog inputs into corresponding digital outputs, and direct current analog outputs. All of the switching functions in the system to be described, with several minor exceptions, are remotely programmable, so that the system may be used as a programmable bridge or control transformer in a variety of equipment, which allows for digital computer control of the operation of the equipment.

It will become evident as the description proceeds that the converter system and apparatus of the present invention has a wide variety of other applications, wherever it is required to convert synchro or resolver analog outputs into corresponding binary coded or pure binary digital signals, or into a direct current analog voltage.

DETAILED DESCRIPTION OF THE ILLUSTRATED EMBODIMENT

Figure 5A:
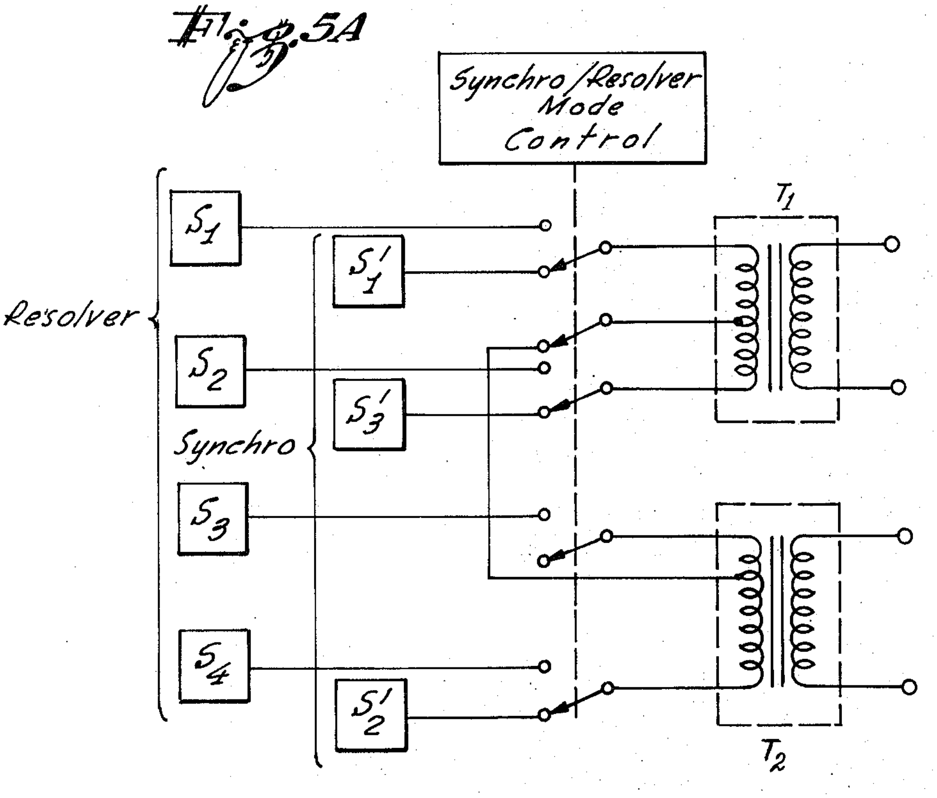
FIG. 5A is a schematic diagram illustrating the manner in which the input of the converter system of FIG. 1 may be adapted either for four-wire resolver shaft angle signals, or three-lead synchro shaft angle signals.

The shaft angle analog inputs are applied to the primary windings of the transformers T1 and T2 of FIG. 5A. As shown, for example, in FIG. 5A, the four-lead resolver input may be applied to input terminals S1, S2, S3 and S4, whereas the three-lead synchro input may be applied to input terminals S1', S3' and S2'. An appropriate synchro/resolver mode control 10 (FIG. 1) is used to operate a series of switches SW1–SW8 so that, in either case, the transformer T1 will generate an output corresponding to the sin $\theta_s$, and the transformer T2 will generate the signal cos $\theta_s$, where $\theta_s$ is the shaft angle of the analog input. The transformers T1 and T2 are connected in a Scott-T transformer configuration.

Figure 5B:
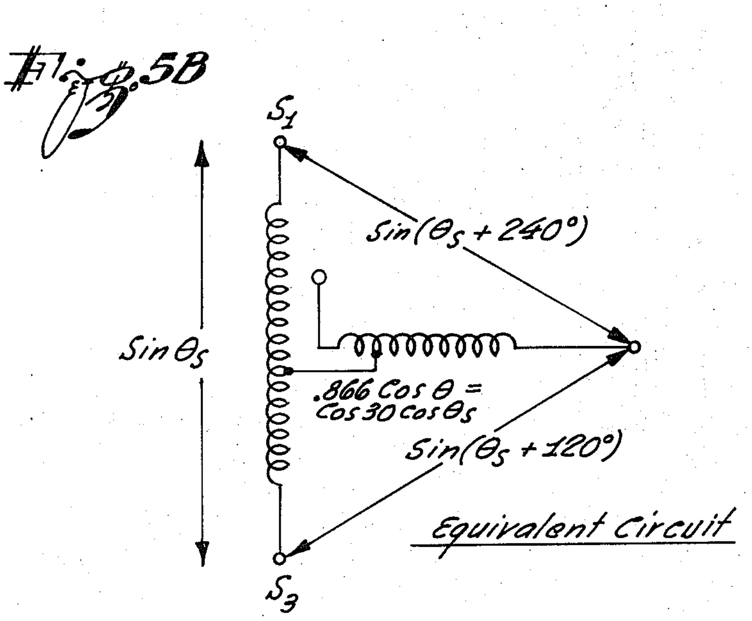
FIG. 5B is an equivalent circuit to that of FIG. 5A and illustrating the manner in which the circuit of FIG. 5A serves to convert the three-lead synchro signals into four-lead shaft angle signals.

As shown in the equivalent circuit of FIG. 5B, for synchro operation, the voltage across the terminals S1 and S3 is a sin $\theta_s$ voltage, and this voltage is used as the sin $\theta_s$ voltage of the resolver. In order to derive the cos $\theta_s$ voltage for the system of FIG. 1, during the synchro mode, the transformers T1 and T2 are interconnected in the manner shown in the equivalent circuit of FIG. 5B, and the voltage from the center tap of the primary of the transformer T1 is equal to cos 60° × cos $\theta_s$. This voltage is inserted at a cos 30° point of the primary of the transformer T2, so that the voltage developed across the secondary of the transformer T2 is then equal to cos $\theta_s$.

For the purposes of the following description, it will be assumed that sin $\theta_s$ is developed at one side of the T1 secondary and $\overline{\sin \theta_s}$ is developed at the other side; and at the same time that cos $\theta_s$ is developed at one side of the secondary of the transformer T2, and $\overline{\cos \theta_s}$ at the other side.

The system of the invention processes the outputs from the transformers T1 and T2 in successive octants. An examination of the diagram of FIG. 2B will show that the sign of the sin $\theta_s$ and cos $\theta_s$ terms will depend on the quadrant being processed. For that reason, a solid state switching circuit shown in FIG. 1 and including, for example, a series of field effect switches SW1–SW8 assure that the sign of the sin $\theta_s$ and cos $\theta_s$ signals applied to the system from the mode control circuit 10 will correspond to the particular octant being processed. The aforesaid field effect switches are commercially available as integrated circuit elements of the type presently designated DC–181.

Figure 1:
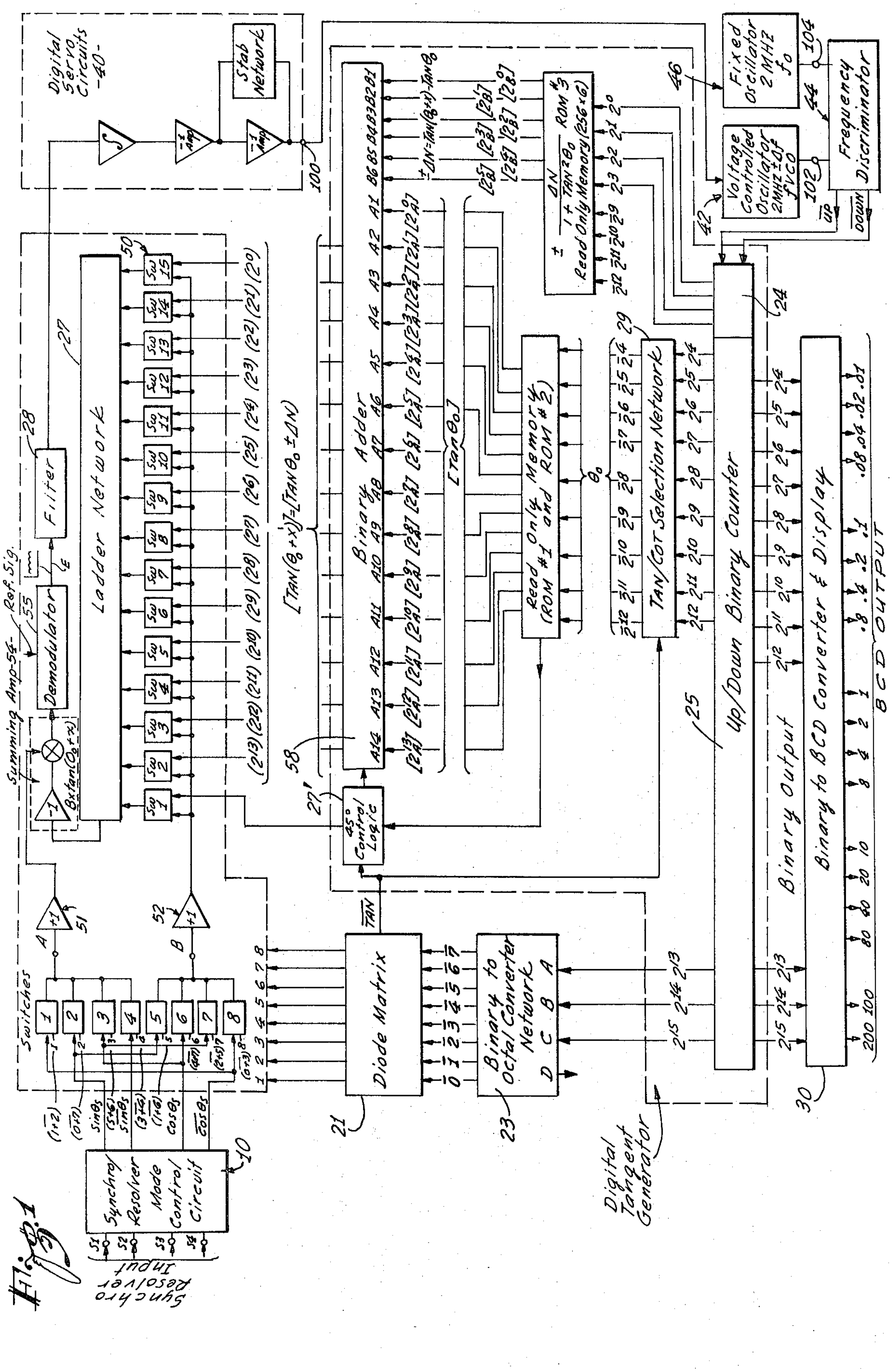
FIG. 1 is a schematic diagram, partly in block form, and partly in circuit detail, illustrating one embodiment of the converter system of the present invention.
Figure 2A:
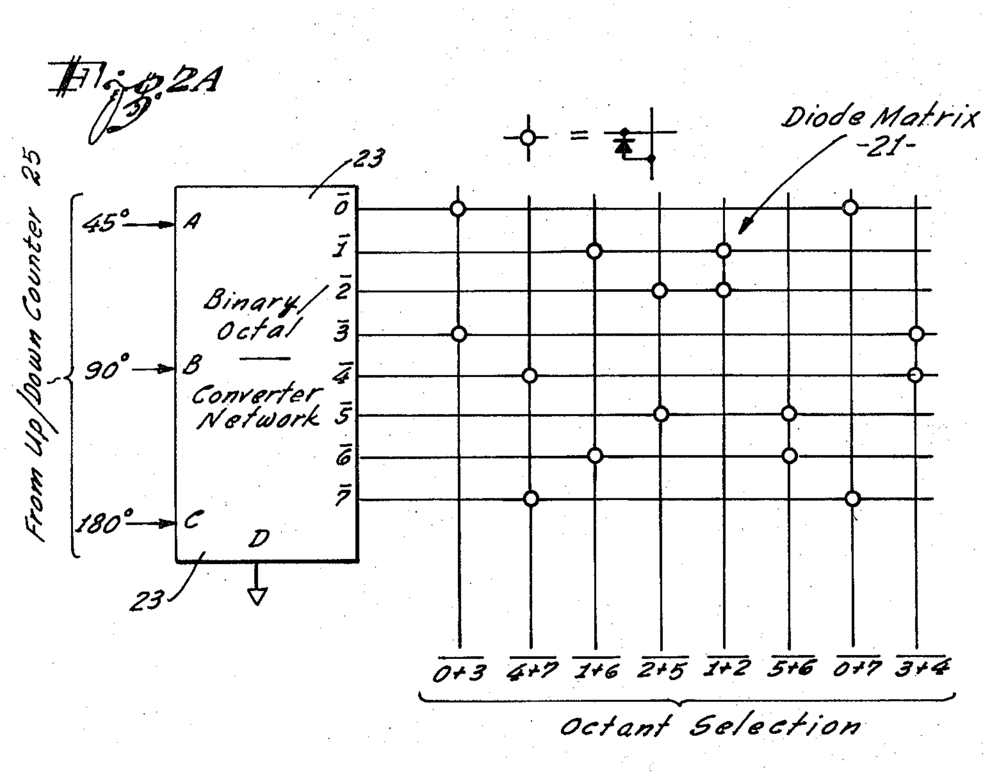
FIG. 2A is a schematic diagram illustrating the manner in which octant selection control signals are produced for introduction to the circuit of FIG. 1.

The switches SW1–SW8 of FIG. 1 are opened and closed by signals derived, for example, from a diode matrix 21 of FIGS. 1 and 2A. The diode matrix 21 is under the control of a binary/octant converter network 23, which may be a commercially available solid state integrated circuit element of the type designated SN7442N. The network 23 responds to a digital input applied to its input terminals A, B and C, and which is coded to represent, for example, 45°, 90° and 180°, to provide corresponding octant outputs at its output terminals $\overline{0\text{–}7}$. The control of the network 23 will be described in more detail in conjunction with FIG. 4. The octant outputs are coverted in the diode matrix 21 into the logic terms indicated.

For example, in the (0°–45°) octant, output $\overline{(0+7)}$ activates the switch SW2 so that sin $\theta_s$ is applied to the A line of the system, and the output $\overline{(0+3)}$ activates the switch SW8 so that $\overline{\cos\theta_s}$ is applied to the B line of the system, which is proper for that octant. For the (45°–90°) octant, the output $\overline{(1+2)}$ activates the switch SW1 and the output $\overline{(1+6)}$ activates the switch SW5, so that cos $\theta_s$ and sin $\theta_s$ are again applied to the system, but reversed insofar as the lines A and B are concerned, which is proper for that octant. For the (90°–135°) octant, for example, the output $\overline{(1+2)}$ again activates the switch SW1 so that $\overline{\cos\theta_s}$ is again applied to the A line of the system, and the output $\overline{(2+5)}$ activates the switch SW7 so that $\overline{\sin\theta_s}$ is applied to the B line of the system, which is proper for that octant, and so on. The binary/octant converter network 23 is under the control of a binary up/down counter 25 in the system of FIG. 1, which will be described in more detail subsequently in conjunction with FIG. 4.

The line A of the system (FIG. 1) is connected to the summing point of amplifier 54, and the line B is connected through a ladder network 27 to the summing point of amplifier 54. The ladder network 27 is under the control of read only memories designated ROM-1 and ROM-2 and ROM-3. The read only memories, in turn, are controlled by the binary up-down counter 25.

The counter 25 supplies binary outputs to a BCD converter 30 which provides the outputs for the system. The read only memory ROM-3 is also under the control of further outputs of the counter 25.

The output of a demodulator 55 is applied through a filter network 28 to digital servo circuits 40 which control a voltage controlled oscillator 42. The output ($f_{vco}$) of the voltage controlled oscillator 42 is applied to a frequency discriminator 44. A reference oscillator 46 applies its output signal ($f_o$) to the discriminator 44. The frequency of the signal ($f_o$) may, for example, be 2 MHz. When the frequency ($f_{vco}$) falls below ($f_o$), a series of pulses is generated on an "$\overline{\text{up}}$" lead from the frequency discriminator, and when the frequency ($f_{vco}$) is higher than ($f_o$), a series of pulses appears on a "$\overline{\text{down}}$" lead. These two leads are connected to the up/down counter 25 to control that counter.

Figure 3:
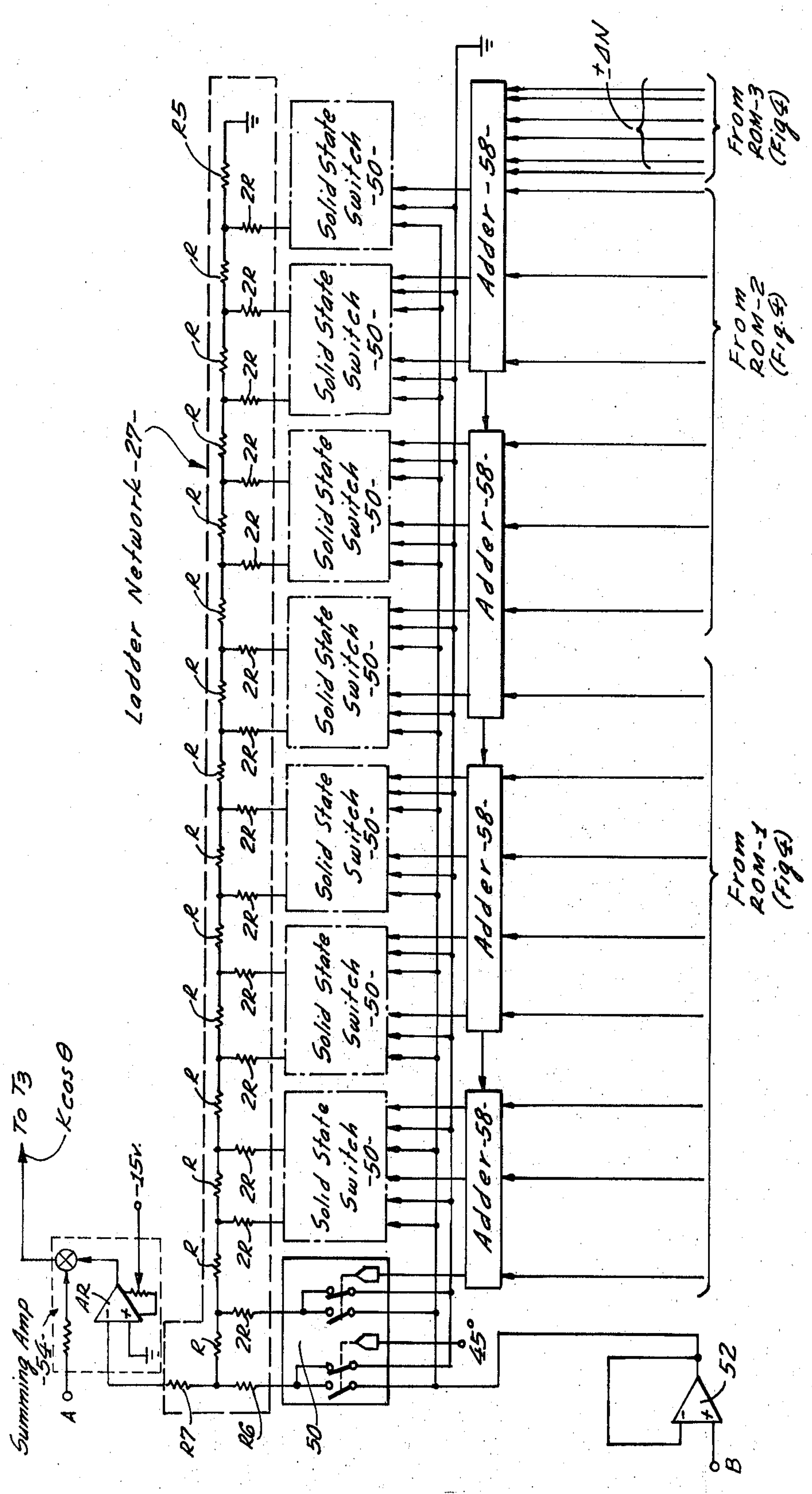
FIG. 3 is a schematic diagram, partly in block form, and partly in circuit detail, showing a ladder network, and its associated switching and other controls, all of which are used for null detection purposes in the circuit and system of FIG. 1.

As shown in FIG. 3, the lader network 27 is made up of a first series of precision resistors designated R, each of which may have a value of 50 kilo-ohms, and of a second series of precision resistors 2R, each of which may have a resistance of 99.97 kilo-ohms. The ladder network 27 is connected through a 100 kilo-ohm resistor R5 at its right-hand end in FIG. 3 to a point of reference potential. The left-hand end of the ladder network is connected to the junction of a 99.97 kilo-ohm resistor R6 and a 100 kilo-ohm resistor R7 and R8.

A pluralit7y of solid state switching networks 50 control the precision resistors R And 2R. The switching networks 50 may be solid state elements of the type presently designated DG190, and the internal circuitry thereof is indicated schematically in the left-hand block 50 of FIG. 3. The terminal B of FIG. 1 is connected through a buffer amplifier 52 to the left-hand solid state switching circuit 50. The resistor R7 is connected to a summing point of amplifier 54 and output of amplifier 54 is connected to the primary of a transformer T3 (not shown) in demodulator 55.

The switches 50 of FIG. 3 are under the control of the up/down counter 25 of FIG. 1 through adders 58. The read only memories ROM-1 and ROM-2 may be alike, and they may be any commercially available solid state read only memories (512 × 8 bits).

Figure 2B:
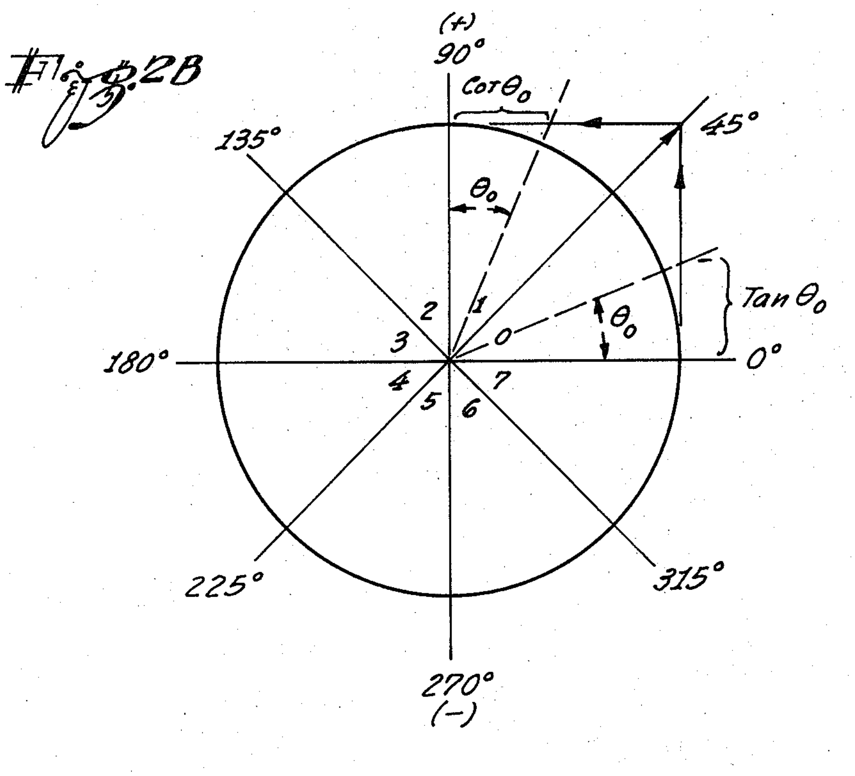
FIG. 2B is a diagram llustrating the various octants which are selectively processed by the converter system of the invention.
Figure 4:
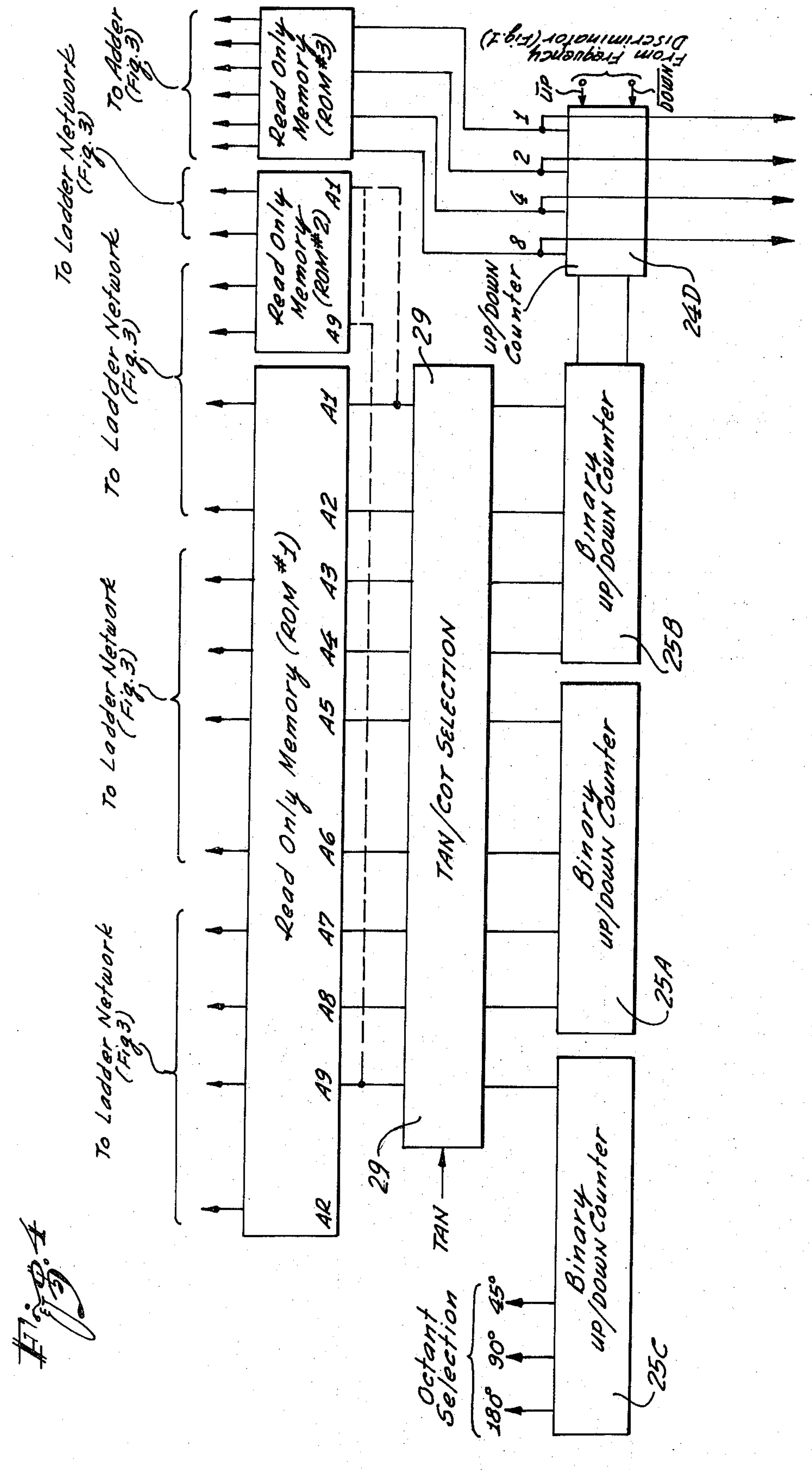
FIG. 4 is a schematic block diagram showing various counters and read-only memories which are used in the control of the ladder network of FIG. 3.

As shown in FIG. 4, the read only memories ROM-1 and ROM-2 are under the control of the binary up/-down counters 25*a*, 25*b* and 25*c* and a tan/cot selection circuit 29. The counters 25*a*, 25*b* and 25*c* make up the counter 25 in FIG. 1. The counters 25*a*, 25*b* and 25*c* may be solid state elements of the type presently designated SN74193. The section 25*c* of the binary counter 25 controls the octant selection network 23 of FIG. 1. Tan/cot selection circuit 29 selects the output of the read only memories in accordance to octant being selected (by controlling the address of read only memories). For example, in the 0-octant the tangent increases when the angle increases, and the opposite occurs for 1-octant, as shown in FIG. 2B. The read only memory ROM-3 provides a further interpolation representing degrees of input angles to a resolution of 0.005°.

The voltage controlled oscillator 42 is a usual voltage controlled multivibrator and is commercially available as integrated circuit (MC4024P). The frequency discriminator 44 is commercially available item as MC4044, or can be any other type.

In the operation of the system, the precision ladder network 27 forms a voltage comparator bridge. The two voltage signals fed into the bridge bear a precise voltage relationship which is determined by the angular position represented by the input signals. As will be described, the ladder network 27 is controlled in a tangent function, and the ladder network is controlled until its setting is equivalent to the angular position represented by the input. When the equivalent angular positions of the tangent network and the input signals are identical, the output of the bridge is null. When the equivalent angular positions of the tangent network and the input signals differ, the bridge produces an error voltage E at the output of demodulator 55, and this error voltage is applied to the digital servo circuits and voltage controlled oscillator 42 to change the output frequency $f_{vco}$ accordingly.

The system of the invention is essentially a binary tangent resolver bridge. To adapt to the bridge for synchro operation, the three-lead synchro input is converted into two voltage signals in a Scott-T transformer circuit, such as described in conjunction with FIGS. 5A and 5B. The transformers T1 and T2 provide complete isolation between the sine and cosine inputs, and they also serve to reduce the secondary-to-primary reflected impedance of the input transformers of the system, so that the system exhibits a desired high input impedance. Because of the high input impedance, the system is essentially insensitive to loading error, and the high input impedance further allows an actual load to be connected in parallel with the system, so that tests may be made of a component under full load conditions.

In a typical servo system, for example, a shaft angle position is converted to an analog voltage by a resolver transmitter. The output of the resolver transmitter is two separate voltages whose amplitudes are determined by the angular position of the shaft. The amplitude of one of the resolver signals is proportional to the sine of the shaft angle $\theta_s$, and the amplitude of the second resolver signal is proportional to the cosine of the shaft angle. The system of the invention responds to the sine and cosine resolver angles to produce a digital output representative of the shaft angle represented thereby. As described above, in the case of a synchro transmitter, its signals are first converted into the corresponding resolver sine and cosine signals by the circuitry of FIG. 5A, and the latter signals are then processed by the system of the invention.

The reference signal input is applied to the demodulator 55 to provide an error voltage E which serves to balance the bridge circuit of the system by control of the ladder network 27. The basic bridge circuit of the system is made up of the ladder network 27 and the summing amplifier 54. The other circuits associated with the ladder network are digital circuits which control the bridge. The basic bridge covers an angular position from 0° – 45° (FIG. 2B) (octant 1), and the following description will be based on operation in the first octant. It will be appreciated that the operation in the successive octants is similar in nature.

The basic equation for the bridge is:

$$\sin \theta_s - \text{Tan}\ \theta_o \cos \theta_s = E \qquad (1)$$

That is, the error voltage output ($E$) of the bridge depends on the voltages ($\sin \theta_s$ and $\cos \theta_s$) representing the input shaft angles and on the voltage representing the tangent of the feedback angle ($\text{Tan}\ \theta_o$). If the feedback angle $\theta_o$ is equal to the input angle $\theta_s$, the error voltage $E$ is zero. In that case, the digital output of the bridge will represent the input angle $\theta_s$.

A resolution down to 0.087° may be established by the circuitry described above with an accuracy of 0.01° or better. In addition, means is provided for interpolating the angle between 0.087° and 0.01°. This interpolation is possible because the angle to be interpolated is very small, that is, it lies between 0.01° and 0.087°. Therefore, $\theta_s = \theta_o + X$, where $\theta_o$ is the angle determined using the general approach generating $\text{Tan}\ \theta_o$. This interpolation permits 0.01° angles to be measured without excessive memory requirements. For example, a system capable of providing 0.01° resolution without the interpolation concept of the invention would require a memory capacity of the order of 114,688 bits, as compared with the memory capacity of the embodiment to be described which is of the order of 512 × 14 (7,168) + 256 × 6 = 8,704 bits.

In general, therefore, when the signals $\sin \theta_s$ and $\cos \theta_s$ are applied to the bridge, the A.C. error voltage occurs at the summing amplifier 54 and the D.C. error voltage E occurs at the output of the demodulator 55.

The magnitude of the error voltage $E$ represents the differences between the input angular position $\theta_s$ and the feedback generated angle $\theta_o$, as per Equation (1). Also, the polarity of the error voltage $E$ determines whether the generated feedback angle $\theta_o$ is greater or smaller than the input angle $\theta_s$. The error voltage $E$, through the digital servo circuit 40, the oscillators 42 and 46, and the frequency discriminator 44, controls the up/down binary counter 25. When the input angular position $\theta_s$ is smaller than the feedback angle $\theta_o$, for example, a series of pulses appears on the $\overline{\text{down}}$ lead to cause the up/down counter 25 to count down; whereas, when the input angle $\theta_s$ is greater than the feedback angle $\theta_o$, a series of pulses appears on the up lead to cause the up down counter 25 to count up.

The up/down counter 25 drives the input of the read only memories ROM-1 and ROM-2 through the tan/cot selection network 29. In a constructed embodiment, for example, the input to the read only memories is a 9 bit binary word, and the output to the ladder network 27 is a 14 bit binary word representing $\text{Tan}\ \theta_o$. The output of the read only memories controls the ladder network 27, and generate the $\text{Tan}\ \theta_o$ term of the Equation (1). The output of the ladder network 27 is the term $\text{Tan}\ \theta_o \cos \theta_s$ which is applied to one side of the summing amplifier 54, whereas the input $\sin \theta_s$ is applied to the other input of the summing amplifier 54. Then, only when the read only memories ROM-1 and ROM-2 generate $\text{Tan}\ \theta_o$, and only when $\theta_o$ equals $\theta_s$, is the error voltage $E$ equal to 0. At that time, the digital servo controls logic will stop the count of the binary counter 25, and the bridge is in balance.

The output of the up/down binary counter 25 represents the angular position angle $\theta_s$, with a resolution of 0.087° and with an accuracy of better than 0.01°, in scaled binary form. The up/down counter 25 addresses the read only memories ROM-1 and ROM-2, so that whenever the counter represents a particular angle, an output is produced by the read only memories corresponding to the tangent of that angle.

In the particular embodiment under consideration, the weight of the binary number is 512 with a resolution of 0.087° (12 bits). This means that 45° (0 octant) is represented by the binary word 512, and in which the least significant bit represents 0.087°. The maximum input word to the input of the read only memories is 512. When the maximum number of 512 is counted by the up/down binary counters 25, the system will transfer 1 bit to the octant selection counter 25*c* in FIG. 4. At the same time, the system will generate (Tan 45° = 1) to the ladder network 27. If the input angle is not in the 0 octant, the up/down binary counter 25*c* will continue to count until the proper octant bits occur (45°, 90° or 180°). These 3 bits determine the octant in which the input angle lies. The output of the diode matrix 21 associated with the octant selection circuit 23, as described in FIG. 2A, selects the proper output from the transformers T1 and T2, corresponding to the particular octant in which the input angle lies.

To obtain a resolution of 0.005°, the interpolation circuit including the up/down counter 24, the adder 58, the further section of the tan/cot outputs, and the ROM-2 memory are added. The basic interpolation equation can be written as:

$$\sin (\theta_o + X) - \text{Tan}\ (\theta_o + X) \cos (\theta_o + X) = 0 \qquad (2)$$

That is:

$$\text{Tan } X = [\text{Tan } (\theta_o + X) - \text{Tan } \theta_o]/[1 + \text{Tan } (\theta_o + X) \text{ Tan } \theta_o] \quad (3)$$

After further approximation:

$$X = [\text{Tan } (\theta_o + X) - \text{Tan } \theta_o]/(1 + \text{Tan}^2 \theta_o) \quad (4)$$

The output of the read only memories ROM-1 and ROM-2 are applied to the adder 58, together with the output $\pm \Delta N$ from the ROM-3. The input to the adder, therefore, is Tan $\theta_o \pm \Delta N$, and the output of the adder is Tan $(\theta_o + X)$, when the error signal $E$ is 0. The output from the ROM-3 is $\pm \Delta N =$ Tan $(\theta_0 + X) -$ Tan $\theta_o$. Therefore, the nominator of Equation (4) is obtained very simply by the output of the ROM-3.

Interpolation may be achieved through the use of the read only memory ROM-3. A four bit input from the up/down counter 24 representing angles 0.0054°, 0.0105°, 0.021° and 0.043° in binary form and a 4 bit input from the tan/cot selection network 29 representing $1 + \tan^2 \theta_o$, are applied to ROM-3 so that the output of the read only memory ROM-3 represents $\pm \Delta N$ in binary form.

As mentioned above, the interpolation system of the invention permits a resolution of 0.005° to be achieved without the concomitant need for excessive capacity of the read only memories.

The invention provides, therefore, an improved and relatively simple converter system for converting angular inputs into correspnding digital or direct current analog voltage outputs.

While a particular embodiment of the invention has been shown and described, modifications may be made. It is intended in the following claims to cover the modifications which come within the spirit and scope of the invention.

What is claimed is:

1. A converter system for converting an analog input corresponding to the angular position of a shaft $(\theta_s)$ with respect to a reference $(\theta)$ into a corresponding digital output, said system comprising: an input circuit for producing a first signal representing a sine of the analog input and a second signal representing the cosine of the analog input; a feedback circuit for providing a feedback signal representing the difference $(\theta_o)$ between the input angle $(\theta_s)$ and the reference angle $(\theta)$; a tangent function generator included in said feedback circuit and controlled thereby so as to cause said function generator to generate signals representative of tan $\theta_o$; a bridge circuit coupled to said tangent function generator and to said input circuit for controlling said feedback circuit; and digital control circuitry included in said feedback circuit for controlling said bridge so as to establish the relationship $\sin \theta_s - \tan \theta_o \cos \theta_s = 0$.

2. The converter system defined in claim 1, in which said input circuit includes a Scott-T transformer network and associated switching circuitry for adapting the system to three-lead synchro inputs.

3. The converter system defined in claim 1, in which said input circuit includes first and second isolation transformers, and mode selection circuitry connected to the output of said transformers for producing said sine and cosine signals with a polarity corresponding to the octant in which said input angle $\theta_s$ lies.

4. The converter system defined in claim 3, in which said digital control circuitry includes up/down counter means, and which includes octant selection circuitry connected to said counter means and controlled thereby to set said mode selection circuitry to a state corresponding to the octant in which said input angle $(\theta_s)$ lies.

5. The converter system defined in claim 1, in which said tangent function generator includes read only memory means, and in which said digital control circuitry includes up/down counter means for controlling said read only memory means.

6. The converter system defined in claim 5 and which includes binary to BCD converter means connected to said counter means for producing a binary coded decimal output representative of the input angle $\theta_s$ with respect to the reference angle $\theta$.

7. The converter system defined in claim 1, in which said bridge circuit includes a precision ladder network controlled by said tangent function enerator.

8. The converter system defined in claim 7, in which said digital control circuitry includes up/down counter means for controlling said tangent function generator.

9. The converter system defined in claim 1, in which said bridge circuit includes a precision ladder network and in which said tangent function generator includes read only memory means for controlling said ladder network, and in which said digital control circuitry includes binary up/down counter means for controlling said read only memory means.

10. The converter system defined in claim 9, in which said digital control circuitry includes an interpolation up/down counter means in circuit with said first mentioned up/down counter means, and which includes adder circuitry interposed between said read only memory means and said ladder network for adding the output of said interpolation counter means to the output of said read only memory means.

11. The system defined in claim 10, and which includes a binary to BCD converter means coupled to said binary up/down counter means for producing a binary coded decimal representation of the analog angle input to said input circuit.

* * * * *